United States Patent [19]

Sakurai et al.

[11] Patent Number: 5,066,997
[45] Date of Patent: Nov. 19, 1991

[54] SEMICONDUCTOR DEVICE

[75] Inventors: Kiyofumi Sakurai; Syuso Fujii, both of Kawasaki; Mitsuru Shimizu, Sakura, all of Japan

[73] Assignee: Kabushiki Kaisha Toshiba, Kawasaki, Japan

[21] Appl. No.: 436,646

[22] Filed: Nov. 15, 1989

[30] Foreign Application Priority Data

Nov. 15, 1988 [JP] Japan .............................. 63-288438

[51] Int. Cl.⁵ ...................... H01L 27/10; H01L 27/15
[52] U.S. Cl. ........................................ 357/45; 357/40; 357/68
[58] Field of Search ................... 357/45, 68, 71, 40, 357/41, 59 J

[56] References Cited

U.S. PATENT DOCUMENTS

| 4,163,245 | 7/1979 | Kinoshita | 357/51 |
| 4,731,642 | 3/1988 | Katto et al. | 357/45 |
| 4,916,514 | 4/1990 | Nowak | 357/45 X |
| 4,958,222 | 9/1990 | Takakura et al. | 357/68 X |

Primary Examiner—Rolf Hille
Assistant Examiner—Roy Potter
Attorney, Agent, or Firm—Banner, Birch, McKie & Beckett

[57] ABSTRACT

A semiconductor device comprises a semiconductor chip and a memory array constituted by a plurality of memory blocks formed in the semiconductor chip and each having the essentially same construction and a plurality of bit lines arranged in columns at a predetermined interval. The semiconductor device further comprises a dummy wiring pattern arranged ajacent to the memory array in the semiconductor chip and including a dummy wiring layer set apart from outermost bit lines of each memory block a distance equal to the predetermined interval.

23 Claims, 6 Drawing Sheets

SEMICONDUCTOR DEVICE

BACKGROUND OF THE INVENTION

1. Field of the Invention

The present invention relates to a semiconductor device having a circuit pattern constituted by a plurality of circuit blocks having the same structure and arranged regularly.

2. Description of the Related Art

Figure 1:
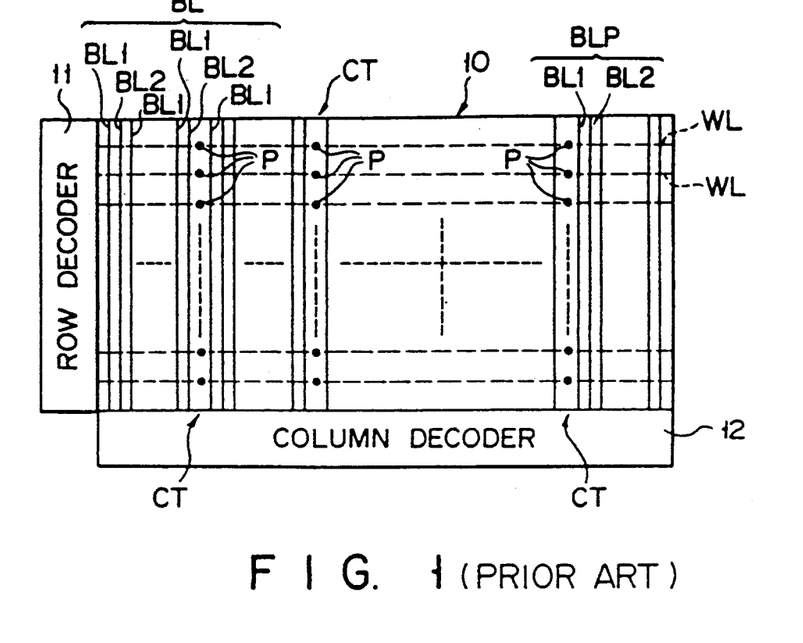
FIG. 1 is a plan view showing a core section of a typical dynamic semiconductor memory device.

A typical dynamic semiconductor memory device has, as a core section, a memory array 10, a row decoder 11 and a column decoder 12, as shown in FIG. 1. The memory array 10 comprises a plurality of dynamic memory cells having the same structure and arranged in rows and columns, a plurality of word lines WL each connected to the memory cells in a corresponding row, and pairs BLP of bit lines BL1 and BL2 each connected to the memory cells in a corresponding column. The row decoder 11 selects word lines WL in accordance with row address signals, to activate the memory cells in the rows connected to the selected word lines WL. The column decoder 12 selects bit line pairs BLP in accordance with column address signals, so as to transfer write data supplied from an external section to the memory cells connected to the selected bit line pair BLP, or readout data read out from the memory cells connected to the selected bit line pair BLP to the external section.

Figure 2:
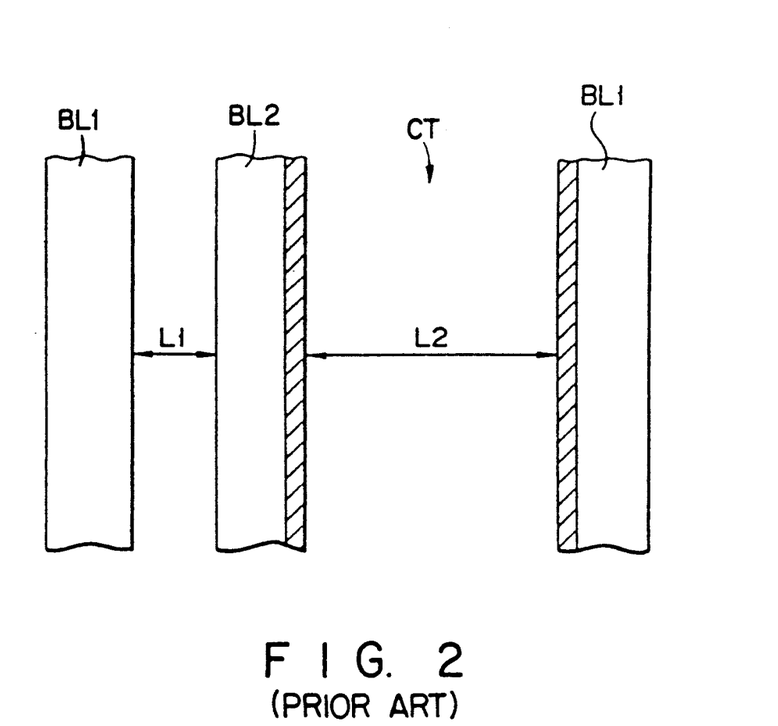
FIG. 2 shows bit lines appearing in FIG. 1, and the distances therebetween.

In this type of semiconductor memory device, the word lines WL are formed over an insulated surface of a semiconductor substrate. The bit lines BL (i.e., BL1 and BL2) are formed on an insulating film that covers the word lines WL. In the case where the word lines WL are formed of polysilicon, a plurality of metal wiring lines AL (not shown) are further formed over an insulating film that covers the bit lines BL, thereby reducing the degree of delay of signals transmitted through the word lines WL. The metal wiring lines AL extend along the word lines WL and are connected to the corresponding word lines WL within contact regions CT arranged at regular intervals. In FIG. 1, points P indicate locations of connection between the metal wiring lines AL and the word lines WL. As shown in FIG. 2, the distance between adjacent two bit lines BL, with the contact region CT interposed therebetween, is set to a greater value L2, than a regular value L1 of the distance between the adjacent two bit lines BL with no contact region interposed therebetween.

A process of manufacturing the bit lines BL will now be described.

First, a metal layer (or a polycide layer of polysilicon and refractory metal) is deposited on the insulating layer covering the word lines WL, and the metal layer is patterned to form the bit lines BL. In the patterning step, a resist film is coated on the metal layer, and the resist film is selectively exposed with use of a mask film that defines the bit lines BL. Thus, a resist pattern can be formed. Then, the metal layer is subjected to dry etching, with the resist pattern used as a mask. Those portions of the metal layer, which are caused to remain, serve as the bit lines BL.

The reduction in size of memory cells is very important to increase the degree of integration of a semiconductor memory device. The design rules of a core section are much stricter that those of the other part. Where the regular distance L1 between bit lines BL is designed to have a very small value, the exposure light amount, with which a resist film is exposed, needs to be greater than a normal exposure light amount. Because, in the case where the normal exposure light amount is insufficient, the distance between the bit lines BL results in a narrower than the designed value. The increase of the exposure light amount makes it difficult to obtain the designed value of the width of the outermost bit lines BL in the memory array 10, and the designed value of the widths of (the distance L2) of adjacent two bit lines between which the contact region CT is interposed. In other words, as shown in FIG. 2, portions (indicated by hatching) of bit lines BL, which adjoin a wide space, are undesirably eliminated, and consequently the width of each of these bit lines BL becomes smaller than that of each of the other bit lines BL. This unbalances the wiring capacitances between the paired bit lines BL1 and BL2 within the memory array 10, and causes the potential differences which are set at the bit line pairs BLP in accordance with the read out data, to vary depending on the unbalance in wiring capacitance. As a result, sense margins of sense amplifiers (not shown) for detecting the potential differences are lowered.

Figure 3:
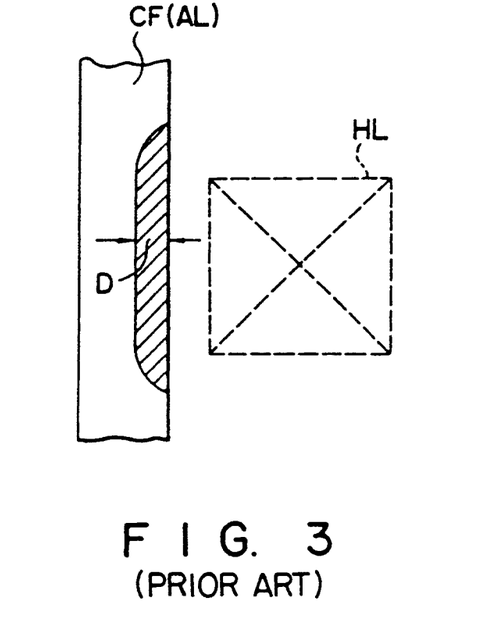
FIG. 3 shows a wiring line formed adjacent to a contact hole within the core section shown in FIG. 1.
Figure 4:
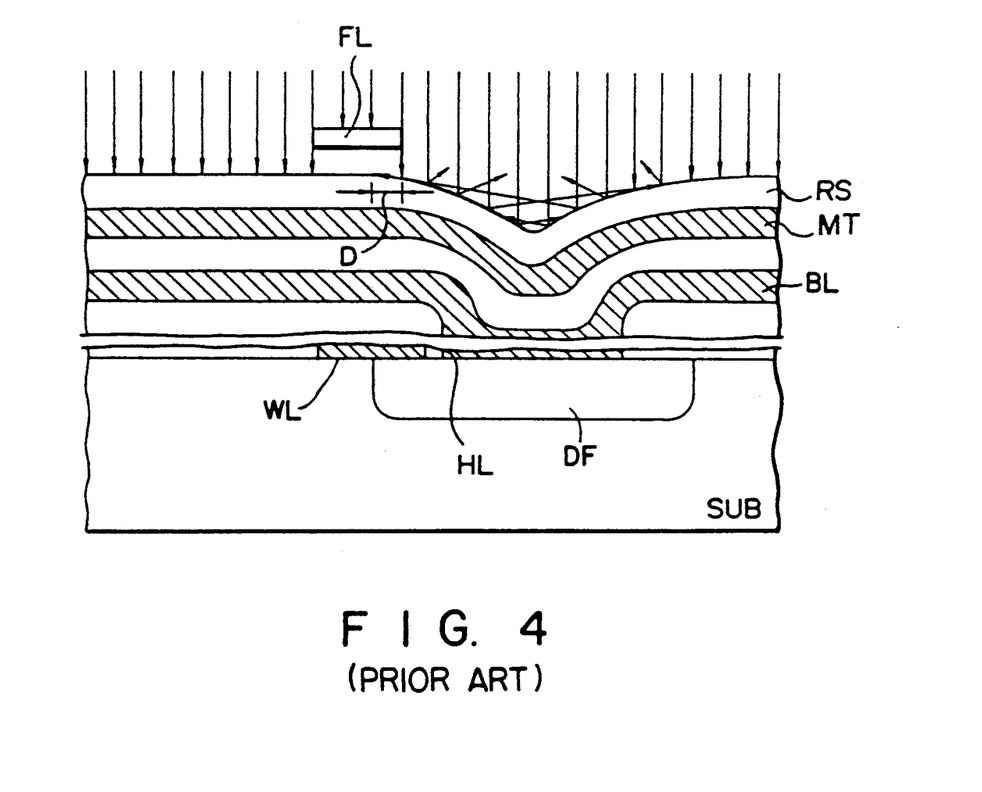
FIG. 4 illustrates a step of forming the wiring line shown in FIG. 3.

In the case where a plurality of wiring lines are superposed over a semiconductor substrate, with insulating layers interposed therebetween, an upper insulating layer tends to have a recessed portion in a region corresponding to a contact hole formed in a lower insulating layer. FIG. 3 shows a wiring line CF (e.g. the metal wiring line AL) formed in the vicinity of the contact hole HL, and FIG. 4 illustrates the step of forming the wiring line CF. The wiring line CF is formed by patterning a metal layer MT shown in FIG. 4. In the patterning step, a resist film RS is formed on the metal layer MT, and the resist film RS is exposed with use of a mask film FL. At this time, light beams are scattered due to unevenness of the resist film RS, the portion of the resist film which must be masked by the mask film FL would be exposed. As a result, if the metal layer MT is etched with use of a resist pattern as a mask, which is obtained after removing the exposed part of the resist film, RS the hatched areas shown in FIG. 3 are unnecessarily removed.

SUMMARY OF THE INVENTION

An object of the present invention is to provide a semiconductor device which can reduce variations in physical characteristics of a plurality of circuit blocks having the same structure and arranged regularly.

This object is achieved by a semiconductor device comprising a semiconductor chip, a circuit pattern constituted by a plurality of circuit blocks having the same structure and arranged in a regular manner in the semiconductor chip; and a dummy circuit pattern arranged adjacent to the circuit pattern in the semiconductor chip, for making the conditions for arrangement of the outermost circuit blocks substantially identical with those for arrangement of the inner circuit blocks.

According to this semiconductor device, a dummy circuit pattern makes the conditions for arrangement of the outermost circuit blocks substantially identical with those for arrangement of the inner circuit blocks. Thus, the physical characteristics of all circuit blocks can be made uniform, irrespective of the conditions of arrangement thereof.

DETAILED DESCRIPTION OF THE PREFERRED EMBODIMENTS

A semiconductor memory device according to an embodiment of the present invention will now be described with reference to FIGS. 5 to 10.

Figure 5:
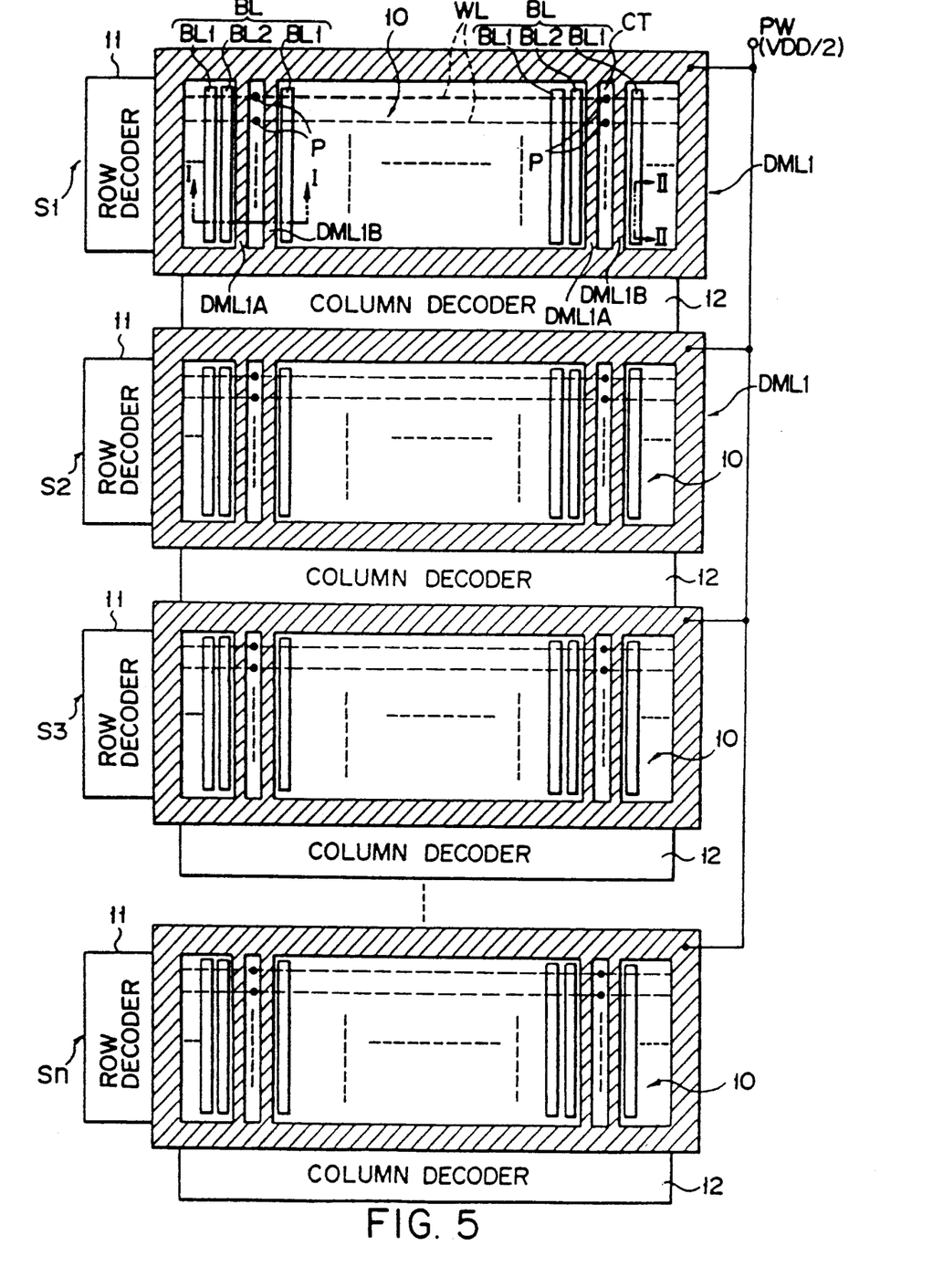
FIG. 5 is a plan view of a structure of a semiconductor memory device according to an embodiment of the present invention.
Figure 6:
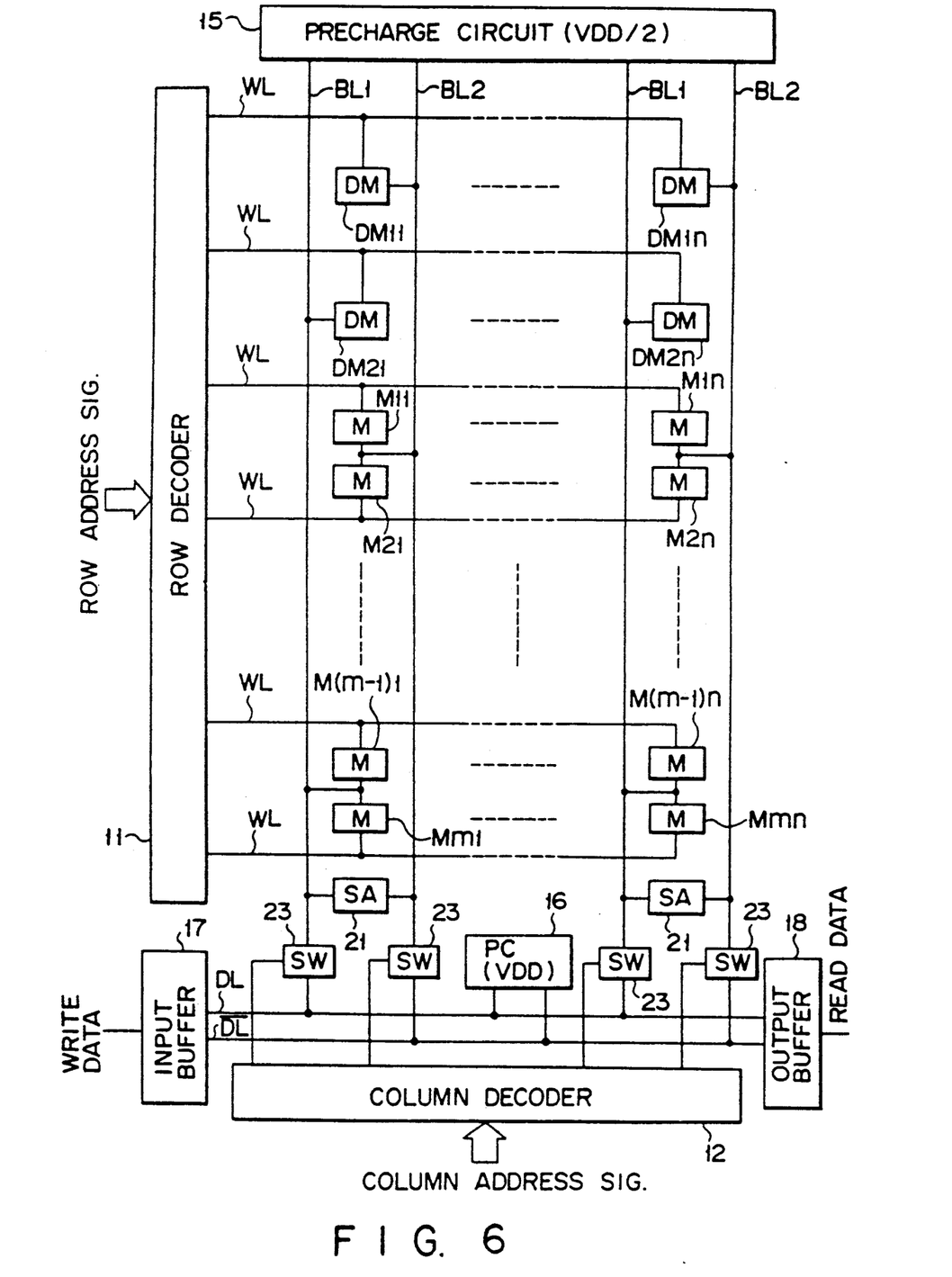
FIG. 6 shows a memory array and its peripheral circuit shown in FIG. 5.
Figure 7:
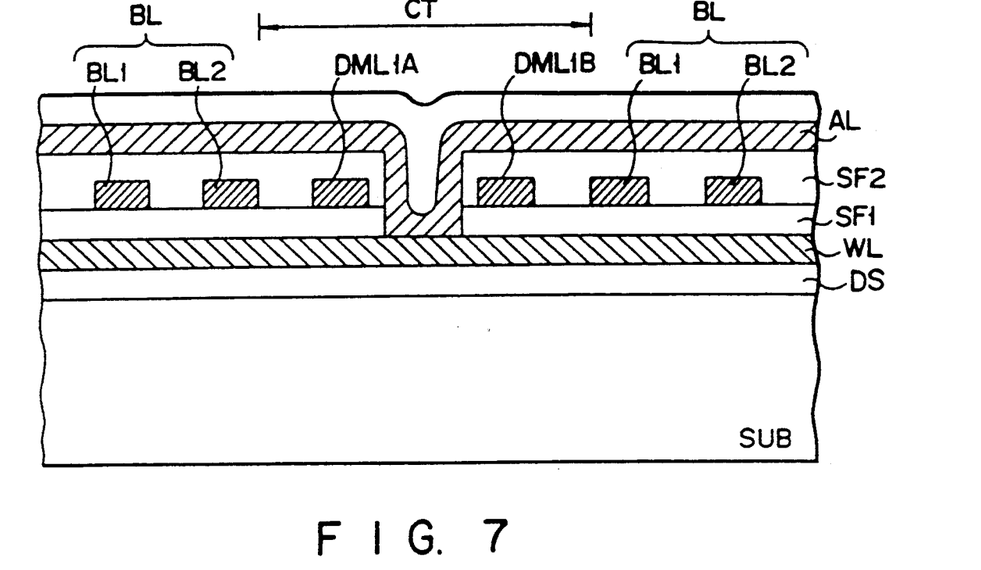
FIG. 7 is a cross-sectional view taken along line I—I in FIG. 5.
Figure 9:
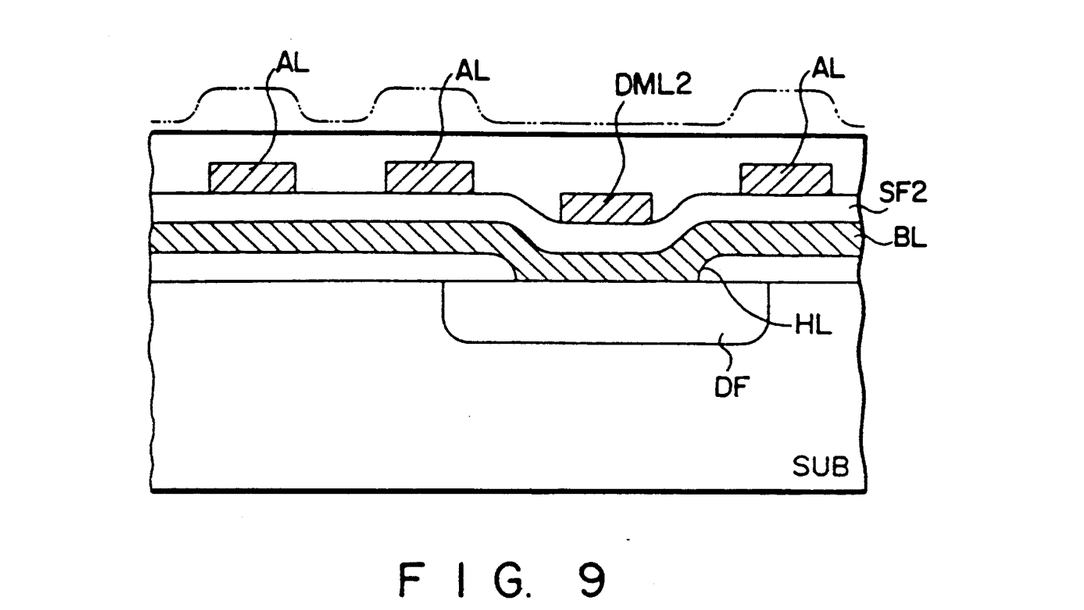
FIG. 9 is a cross-sectional view taken along line II—II in FIG. 5 to show a dummy wiring line formed above a contact hole within the memory array.
Figure 10:
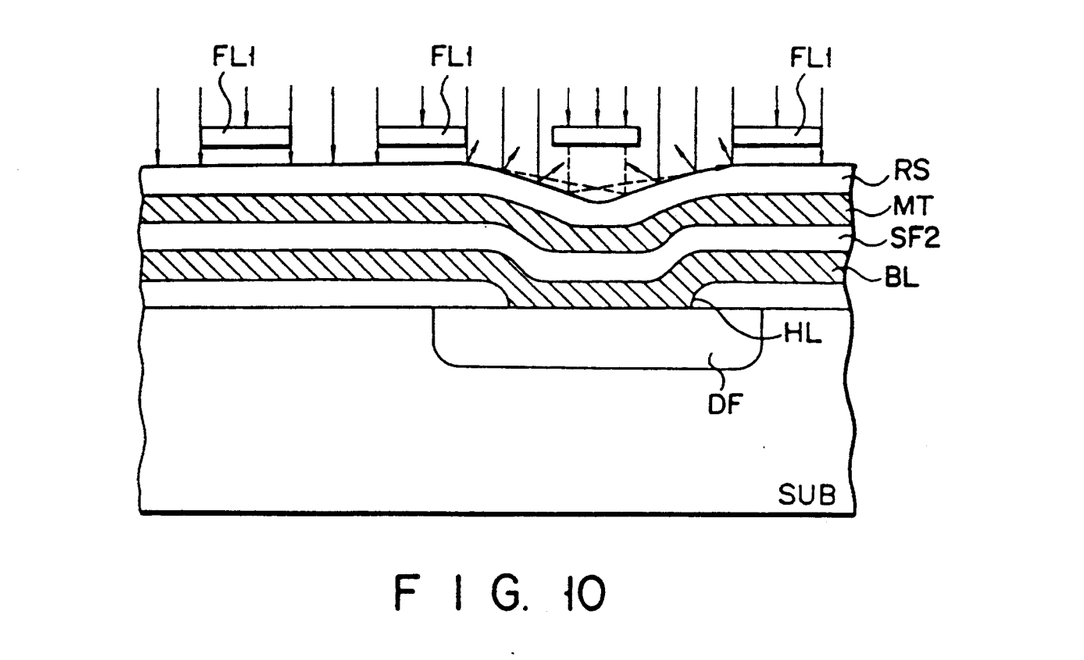
FIG. 10 illustrates a step of forming the dummy wiring line shown in FIG. 9.

FIG. 5 is a plan view of a structure of the semiconductor memory device, FIG. 6 shows a memory array and its peripheral circuit shown in FIG. 5, FIG. 7 is a cross-sectional view taken along line I—I in FIG. 5, and FIG. 9 is a cross-sectional view taken along line II—II in FIG. 5.

In FIGS. 5 to 10, the reference numerals, which have appeared in FIG. 1, denote the same structural elements.

The semiconductor memory device comprises memory sections Sl to Sn arranged in a semiconductor chip in a manner shown in FIG. 5. Each memory section has a memory array 10, a row decoder 11 and a column decoder 12. The memory array 10, row decoder 11 and column decoder 12 of each memory section Sl to Sn have conventional structures.

In each memory section Sl to Sn, the memory array 10 includes dynamic memory cells Ml1 to Mmn and DMl1 to DM2n (see FIG. 6) having the same structure and arranged in rows and columns, word lines WL connected to the memory cells Ml1 to Mmn and DMl1 to DM2n on the corresponding rows, and pairs BLP of bit lines BL1 and BL2 connected to the memory cells Ml1 to Mmn and DMl1 to DM2n on the corresponding columns. For example, the memory cells Ml1 to Mln and dummy memory cells DMl1 to DMln are connected to the bit lines BL2 of the corresponding bit line pairs, and the memory cell Mml to Mmn and dummy memory cells DM2l to DM2n are connected to the lines BL1 of the corresponding bit line pairs. The row decoder 11 selects, in accordance with row address signals, one of the word lines WL connected to the dummy memory cells DMl1 to DM2n, and one of the word lines WL connected to the memory cells Ml1 to Mmn, and activates the memory cells connected to the selected two word lines. The dummy memory cells DMl1 to DMln are activated along with the memory cells connected to bit lines BL1, for example, the memory cells Mml to Mmn, and the dummy memory cells DM2l to DM2n are activated along with the memory cells connected to bit lines BL2, for example, the memory cells Mll to Mln. The column decoder 12 selects, in accordance with column address signals, one of the bit line pairs BLP, and renders a pair of switches 23 connected to the selected pair of bit lines BL1 and BL2. Write data is supplied from an external section to the switch pair 23 via an input buffer 17 and a pair of data lines DL and $\overline{DL}$. Read data are supplied to an external section via the switch pair 23, the pair of data lines DL and $\overline{DL}$ and output buffer 18. The potentials of all bit lines BL (BL1 and BL2) are set to a VDD/2 level by a precharge circuit 15 in advance of the supply of the write data and read data, and the potentials of the data lines DL and $\overline{DL}$ are set to a VDD level in advance of the supply of the write data and read data. Further, one of the paired bit lines BL1 and BL2 is constantly set to the VDD/2 level in accordance with the data read out from the activated dummy memory cell after precharge, and the potential of the other of the paired bit lines is slightly changed in accordance with the data read out from the activated memory cell. Sense amplifiers 21 are connected to the respective pairs of bit lines BL1 and BL2. Each sense amplifier 21 detects the potential difference between the bit lines BL1 and BL2, of a corresponding bit line pair and amplifies the potential difference between the bit lines BL1 and BL2 such that the potential of one of the bit lines BL1 and BL2 is set to the VDD level, and the potential of the other bit line is set to a ground level.

In this semiconductor memory device, as shown in FIG. 7, word lines WL are formed on an insulative surface DS of a semiconductor substrate SUB. Bit lines BL (BL1 and BL2) are formed on an insulative film SF1 covering the word lines WL. Metal wiring lines AL are formed on an insulative film SF2 covering the bit lines BL1 and BL2. Each metal wiring lines AL extends along a corresponding word line WL and is connected to the corresponding word line WL in contact regions CT provided at regular intervals. The memory array 10 is divided into memory blocks by the contact regions CT. The word lines WL are formed of polysilicon, and the bit lines BL (BL1 and BL2) and metal wiring lines AL are formed of aluminum.

Figure 8:
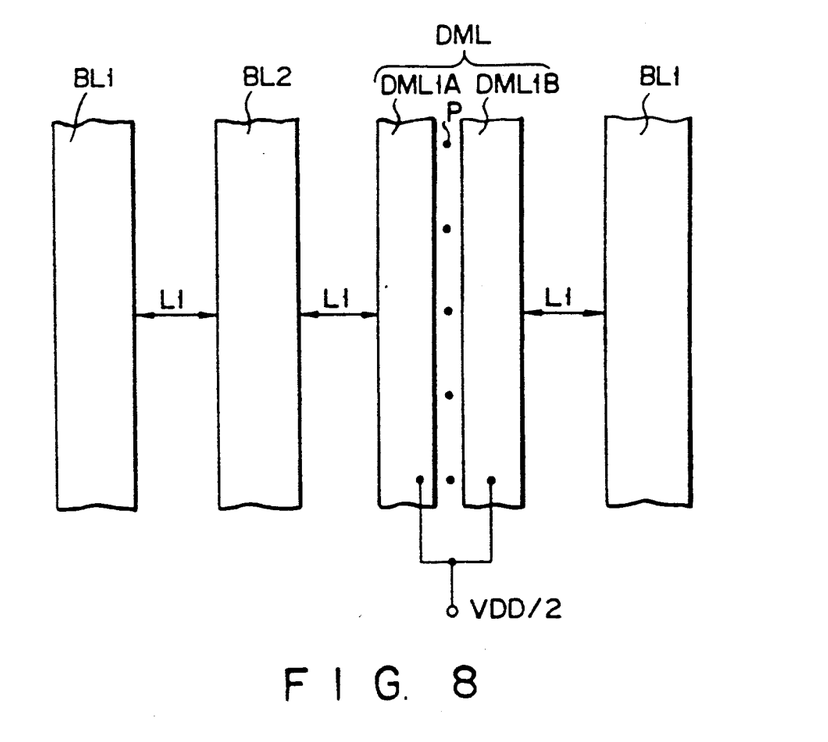
FIG. 8 shows a dummy bit line provided in a contact region shown in FIG. 5.

As shown in FIGS. 5 to 7, the semiconductor memory device has first dummy wiring layer DML1 uniformly surrounding the memory array 10 and set apart from the outer most bit lines BL of the memory array 10 a distance equal to a standard interval L1 between adjacent two bit lines BL. The first dummy wiring layers DML1 comprises, as shown in FIG. 8, portions DML1A and DML1B, set apart from two outermost bit lines of the memory blocks located on both sides of each contact region CT a distance equal to the standard interval L1. The first dummy wiring layer DML1 is connected to a power source terminal PW having a VDD/2 potential level that is equal to the potential of one of the paired bit lines BL1 and BL2 determined in accordance with the data read out from the dummy memory cell.

The first dummy wiring layer DML1 is formed in a step of forming the bit lines BL. In the step of forming the bit lines BL, an aluminum layer is deposited on the insulative film SF1 covering the word lines WL, and the aluminum layer is patterned. In this pattering step, a resist film is coated on the aluminum layer, and the resist film is selectively exposed with use of a mask film that defines the bit lines BL and the first dummy wiring layer DML1. Thus, a resist pattern is formed. Then, the aluminum layer is subjected to dry etching with use of the resist pattern as mask. Those portions of the aluminum layer, which have been left after the dry etching, form the bit lines BL and first dummy wiring layer DML1.

This semiconductor memory device has, as shown in FIG. 9, a second dummy wiring layer DML2 above the contact hole HL formed in the core section. Due to the simplification of the figure, the word lines WL are not shown in FIG. 9. In FIG. 9, the bit line BL is connected through the contact hole HL to a diffusion layer DF which is formed in the semiconductor substrate and used for forming a transistor of the memory cell. The insulative film SF2 is formed to cover the bit line BL. The insulative film SF2 has a recessed portion in a region corresponding to the contact hole HL. When metal wiring lines AL are formed by patterning an aluminum layer MT (shown in FIG. 10), those portions of the formed metal wiring lines AL, which are adjacent to the contact hold HL, may be corroded, as shown in FIG. 3. However, in the step of forming the metal wiring lines AL the aluminum layer MT is patterned with use of a mask film FL1 defining not only the metal wiring lines AL but also the second dummy wiring layer DML2. Part of the mask film FL1 defining the second dummy wiring layer DML2 prevents the exposure beams from being reflected from a resist film RS coated on the aluminum layer MT and from being scattered undesirably. Consequently, each metal wiring line AL is formed with a designed width.

According to the above embodiment, the first dummy wiring layer DML1 is formed so as to uniformly surround the memory array 10. Thus, the outermost memory cells of the memory array 10 are not influenced by irregular wiring of the row decoder 11, column decoder 12 and other peripheral circuits arranged outside the memory array 10, and can have the same wiring capacitances as the inner memory cells of the memory array 10.

Even if the memory array 10 is divided into memory blocks by the contact regions CT in which each work line WL is connected to a corresponding metal wiring line AL since the first dummy wiring layer DML1 has portions DML1A and DML1B formed in each contact region CT and set apart from the outermost bit lines BL of the memory blocks located on both sides of the contact region CT a distance equal to the standard distance L1 between adjacent two bit lines BL, the width of each bit line BL can be set to a design value, and imbalance in wiring capacitances of bit line pairs BLP is not caused by the nonuniformity in widths of the bit lines.

Further, according to this embodiment, the second dummy wiring layer DML2 is arranged above the contact hole HL to prevent the metal wiring lines AL, formed in the patterning step common to the patterning step of this second dummy wiring layer DML2 from being corroded due to scattering of exposure beams. In this case, the metal wiring lines AL can be formed uniformly with no difficulty. In other words, the uniformity in the wiring capacitances is not deteriorated by the unevenness of the base layer for the metal wiring lines AL. Further, the second dummy wiring layer DML2 formed above the contact hole HL can reduce the unevenness of the layer placed above the contact hole HL. For example, when a protection layer covering the metal wiring lines AL is formed and then this protection film is flattened, it is not necessary to excessively reduce the thickness of the protection layer.

Furthermore, according to this embodiment, the first dummy wiring layer DML is connected to a power source terminal set to the VDD/2 potential level. In the memory array 10, each of the internal bit lines is located between two bit lines, and each of the outermost bit lines is located between one bit line and the first dummy wiring layer DML. In the case where the dummy wiring layer DML1 is in the electrically floating condition, the potential of the first dummy wiring layer DML1 is, just after the precharge, not equal to the potential of the outermost bit line. In this case, there is a concern that the outermost bit line may suffer electrical influence, different from that exerted on the adjoining bit line. For this, reason, the first dummy wiring layer DML is connected to a power source terminal having a fixed potential. When the potential of the power source terminal is set to the VDD/2 level, as in the present embodiment, the electric influence upon the outermost bit line is very close to that upon the internal bit lines. In addition, the potential of the first dummy wiring layer DML1 may be set by the precharge circuit 15.

In the embodiment, aluminum is used as material for the bit lines BL. Instead, the bit lines BL can be a polycide layer formed of polysilicon and refractory metal.

What is claimed is:

1. A semiconductor device comprising:
   a semiconductor chip in which a plurality of circuit elements having essentially the same structure are arranged in a regular manner;
   a first insulating layer formed on the semiconductor chip;
   a plurality of first wiring lines connected to said circuit elements grouped in pair and arranged in parallel formed on said first insulating layer with a first predetermined interval between each of said wiring lines in the same pair and a second predetermined interval between said pairs said plurality of first wiring lines formed substantially in a first plane;
   a second insulating layer formed on the plurality of first wiring lines;
   a plurality of second wiring lines formed on said second insulating layer and arranged in parallel third and fourth predetermined intervals in a direction perpendicular to said first wiring lines, each of said second wiring lines having a plurality of segments extending through the first insulating layer, the first plane and the second insulating layer in the direction of said semiconductor chip at a plurality of first predetermined positions, said first predetermined positions being located within the second predetermined intervals; and
   a plurality of first dummy wiring lines formed substantially in the first plane and in parallel with said first wiring lines, said first dummy wiring lines being arranged within said second predetermined interval such that a first dummy wiring line is between each first predetermined position and each pair of first wiring lines.

2. The semiconductor device according to claim 1, wherein said first wiring lines have a plurality of segments extending through the first insulating layer to said semiconductor chip connected to said plurality of circuit elements at second predetermined position and said device further comprising a plurality of second dummy wiring lines formed at each of the second predetermined positions and arranged in parallel with said second wiring lines.

3. The semiconductor memory device according to claim 1, wherein a first dummy wiring line is arranged within the second predetermined interval such that a first predetermined interval is between the first dummy wiring line and a first predetermined position and a first predetermined interval is between the first dummy wiring line and a pair of first wiring lines.

4. A semiconductor memory device comprising:
a semiconductor chip;
a memory array formed in said semiconductor chip, said memory array arranged in a regular manner and including memory blocks having essentially the same structure;
a plurality of word lines connected to said memory blocks and arranged in parallel on said semiconductor chip at first predetermined intervals;
a plurality of bit line pairs connected to said memory blocks, said bit line pairs being arranged on said word lines through a first insulating layer in a direction perpendicular to said word lines and arranged in parallel at second predetermined intervals, and bit lines constituting said bit line pairs being arranged in parallel at the second predetermined intervals;
a plurality of metal wiring layers formed on said bit line pairs through a second insulating layer, said metal wiring layers extending along said word lines and being connected to corresponding word lines in contact regions arranged at regular intervals, and said bit line pairs having an interval which is larger than said second predetermined interval in the vicinity of said contact regions; and
first dummy wiring lines arranged near said contact regions, said first dummy wiring lines being arranged in parallel with said bit line pairs and apart from said bit line pairs adjacent to said contact regions by a distance corresponding to said second predetermined interval.

5. The semiconductor memory device according to claim 4, wherein each of said memory blocks includes a dynamic memory cell connected to a corresponding bit line.

6. The semiconductor memory device according to claim 5, further comprising a potential setting means for setting the potential of said first dummy wiring lines at a predetermined level.

7. The semiconductor memory device according to claim 6, wherein said potential setting means includes a potential terminal and a wiring line connected between said potential terminal and said first dummy wiring lines.

8. The semiconductor memory device according to claim 7, wherein the potential of said potential terminal is set equal to a precharge potential for said bit line pairs.

9. The semiconductor memory device according to claim 7, wherein the potential of said potential terminal is set equal to a precharge potential for said bit line pairs.

10. The semiconductor memory device according to claim 4, wherein said bit lines are connected to said memory blocks by contact holes at predetermined positions, and said device further comprises second dummy wiring lines arranged on said contact holes through said second insulating layer and arranged in parallel with said metal wiring layers.

11. The semiconductor memory device according to claim 10, wherein each of said memory blocks includes a dynamic memory cell connected to a corresponding bit line.

12. The semiconductor memory device according to claim 11, further comprising a potential setting means for setting the potential of said first dummy wiring lines at a predetermined level.

13. The semiconductor memory device according to claim 11 wherein said memory array includes dummy memory cells which surround said dynamic memory cells.

14. The semiconductor memory device according to claim 12, wherein said potential setting means includes a potential terminal and a wiring line connected between said potential terminal and said first dummy wiring lines.

15. The semiconductor memory device according to claim 14, wherein the potential of said potential terminal is set equal to a precharged potential for said bit line pairs.

16. A semiconductor memory device comprising:
a semiconductor chip;
a memory array formed in said semiconductor chip, said memory array arranged in a regular manner and including memory blocks having essentially the same structure;
a first insulating layer formed on said memory array;
a plurality of word lines connected to said memory blocks and arranged in parallel on said first insulating layer at first predetermined intervals;
a second insulating layer formed on said plurality of word lines;
a plurality of bit lines connected to said memory blocks, said bit lines being grouped in pairs and formed on the second insulating layer and arranged in parallel with second predetermined intervals between each pair and in a direction perpendicular to said word lines, the bit lines forming each said bit line pair being arranged at a third predetermined interval, the third predetermined interval being smaller than the second predetermined interval;
a third insulating layer formed on said plurality of bit line pairs;
a plurality of metal wiring lines formed on said third insulating layer, each of said metal wiring lines corresponding to one of the plurality of word lines, extending along said corresponding word line and being connected to the corresponding word line at a plurality of contact regions arranged at first regular intervals, the contact regions extending through the first, second and third insulating layers and the first regular intervals corresponding to the second predetermined intervals; and
first dummy wiring lines formed on the second insulating layer in parallel with the bit line pairs and arranged near said contact regions, such that said first dummy wiring lines are arranged between said bit line pairs and said contact regions.

17. The semiconductor memory device according to claim 16, wherein each of said memory blocks includes at least one dynamic memory cell corresponding to a word line and a bit line, the at least dynamic memory cell being connected to the corresponding word line and the corresponding bit line.

18. The semiconductor memory device according to claim 17, further comprising a potential setting means coupled to the first dummy wiring lines for setting the potential of said first dummy wiring lines at a predetermined level.

19. The semiconductor memory device according to claim 16, wherein said bit lines are connected to said memory blocks by contact holes at predetermined positions, said device further comprising a plurality of second dummy wiring lines arranged on said second insulating layer at each predetermined position of the contact holes.

20. The semiconductor memory device according to claim 19, wherein each of said memory blocks includes at least one dynamic memory cell corresponding to a word line and a bit line, the at least one dynamic memory cell being connected to the corresponding word line and the corresponding bit line.

21. The semiconductor memory device according to claim 20, further comprising potential setting means coupled to the first dummy wiring lines for setting the potential of said first dummy wiring lines at a predetermined level.

22. The semiconductor memory device according to claim 20, wherein said memory array includes a plurality of dummy memory cells coupled to said dynamic memory cells through the plurality of bit lines.

23. The semiconductor memory device according to claim 16, wherein a first dummy wiring line is arranged within the second predetermined interval such that a third predetermined interval is between the first dummy wiring lines and a contact region and a third predetermined interval is between the first dummy wiring line and a pair of first wiring lines.

* * * * *